United States Patent
Choi et al.

(10) Patent No.: US 8,519,393 B2
(45) Date of Patent: Aug. 27, 2013

(54) THIN FILM TRANSISTOR ARRAY PANEL AND MANUFACTURING METHOD THEREOF

(75) Inventors: Tae-Young Choi, Seoul (KR); Hi-Kuk Lee, Yongin-si (KR); Bo-Sung Kim, Seoul (KR); Young-Min Kim, Yongin-si (KR); Seung-Hwan Cho, Suwon-si (KR); Young-Soo Yoon, Anyang-si (KR); Yeon-Taek Jeong, Suwon-si (KR); Seon-Pil Jang, Seoul (KR)

(73) Assignee: Samsung Display Co., Ltd. (KR)

( * ) Notice: Subject to any disclaimer, the term of this patent is extended or adjusted under 35 U.S.C. 154(b) by 246 days.

(21) Appl. No.: 12/823,043

(22) Filed: Jun. 24, 2010

(65) Prior Publication Data

US 2011/0140094 A1    Jun. 16, 2011

(30) Foreign Application Priority Data

Dec. 10, 2009  (KR) .................. 10-2009-0122378

(51) Int. Cl.
*H01L 27/146* (2006.01)
*H01L 29/786* (2006.01)

(52) U.S. Cl.
USPC ........... 257/59; 257/72; 257/613; 257/291; 257/E27.133; 257/E29.273

(58) Field of Classification Search
USPC ............. 257/59, 72, 291, 347, 613, E27.133, 257/E29.296, E29.273
See application file for complete search history.

(56) References Cited

U.S. PATENT DOCUMENTS

| | | | |
|---|---|---|---|
| 5,869,364 A | 2/1999 | Nakano et al. | |
| 5,976,920 A | 11/1999 | Nakano et al. | |
| 6,586,768 B1 * | 7/2003 | Huang et al. | 257/59 |
| 7,638,360 B2 * | 12/2009 | Ryu et al. | 438/104 |
| 2006/0071211 A1 * | 4/2006 | Lee | 257/59 |
| 2008/0283831 A1 * | 11/2008 | Ryu et al. | 257/43 |
| 2010/0006833 A1 * | 1/2010 | Ha et al. | 257/43 |
| 2010/0127257 A1 * | 5/2010 | Ryu et al. | 257/43 |
| 2010/0193779 A1 * | 8/2010 | Lee | 257/40 |

FOREIGN PATENT DOCUMENTS

| | | |
|---|---|---|
| JP | 1983-135679 A | 8/1983 |
| JP | 1994-077485 A | 3/1994 |
| JP | 2008-171990 A | 7/2008 |
| KR | 1995-0001160 B1 | 2/1995 |
| KR | 1019970018745 A | 4/1997 |
| KR | 1019980006514 A | 3/1998 |
| KR | 1019980012632 A | 4/1998 |
| KR | 100809750 B1 | 2/2008 |

* cited by examiner

*Primary Examiner* — Victor A Mandala
(74) *Attorney, Agent, or Firm* — Innovation Counsel LLP

(57) ABSTRACT

A thin film transistor array panel according to an exemplary embodiment of the present invention includes: a gate electrode disposed on an insulation substrate; a gate insulating layer disposed on the gate electrode; a semiconductor disposed on the gate insulating layer; an etching stop layer disposed on the semiconductor; an insulating layer disposed on the gate insulating layer; and a source electrode and a drain electrode overlapping the semiconductor. The semiconductor and the gate insulating layer have a first portion on which the etching stop layer and the insulating layer are disposed, and a second portion on which etching stop layer and the insulating layer are not disposed. The source electrode and the drain electrode are disposed on the second portion of the semiconductor and the gate insulating layer.

9 Claims, 10 Drawing Sheets

THIN FILM TRANSISTOR ARRAY PANEL AND MANUFACTURING METHOD THEREOF

CROSS-REFERENCE TO RELATED APPLICATION

This application claims priority to, and the benefit of, Korean Patent Application No. 10-2009-0122378 filed in the Korean Intellectual Property Office on Dec. 10, 2009, the entire contents of which are incorporated herein by reference.

BACKGROUND OF THE INVENTION (a) Field of the Invention

The present invention relates generally to flat panel displays. More specifically, the present invention relates to.

(b) Description of the Related Art

Liquid crystal displays are one common form of flat panel displays. A liquid crystal display typically has two display panels on which electrodes are formed, with a liquid crystal layer interposed therebetween. In such a liquid crystal display, voltages are applied to the electrodes so as to align liquid crystal molecules of the liquid crystal layer. This alignment controls the light transmittance of the liquid crystal layer, thereby allowing for the display of images.

One of the two display panels of the liquid crystal display typically includes a thin film transistor (TFT) array panel that is used, in effect, as a circuit board for independently driving pixels in the liquid crystal display. It should also be noted that this general approach can also be utilized in other types of displays, such as organic electro luminescence (EL) display devices.

The thin film transistor array panel commonly includes a signal wire or a gate wire transmitting a scanning signal, an image signal line or a data wire transmitting an image signal, a thin film transistor connected to the gate wire and the data wire, a pixel electrode connected to the thin film transistor, a gate insulating layer covering the gate wire for insulating, and an interlayer insulating layer covering the thin film transistor and the data wire.

To manufacture this TFT array panel, a photosensitive film is typically formed for every layer deposited, and these layers are etched by using the photosensitive films as masks to form the pattern of each layer.

When the semiconductor layer of the TFT is an oxide semiconductor, an etching preventing layer is typically formed thereon, to reduce damage to the oxide semiconductor caused by etching of the TFT's source and drain electrodes. However, both the etching preventing layer and the mask typically required for forming this etching preventing layer add to the cost and complexity of the manufacturing process.

The above information disclosed in this Background section is only for enhancement of understanding of the background of the invention. It therefore may contain information not in the prior art.

SUMMARY OF THE INVENTION

Embodiments of the present invention advantageously reduce the cost and complexity of manufacturing displays with TFTs that include oxide semiconductors.

A thin film transistor array panel according to an exemplary embodiment of the present invention includes: a gate electrode disposed on an insulation substrate; a gate insulating layer disposed on the gate electrode; a semiconductor disposed on the gate insulating layer; an etching stop layer disposed on the semiconductor; an insulating layer disposed on the gate insulating layer; and a source electrode and a drain electrode overlapping the semiconductor. The semiconductor and the gate insulating layer have a first portion on which the etching stop layer and the insulating layer are disposed, and a second portion on which etching stop layer and the insulating layer are not disposed. Also, the source electrode and the drain electrode are disposed on the second portion of the semiconductor and the gate insulating layer.

The etching stop layer and the insulating layer may be in the same layer.

The semiconductor may be an oxide semiconductor.

The oxide semiconductor may include at least one of GIZO, ZTO (ZnSnO), and IZO.

The thin film transistor array panel may further include: a gate line connected to the gate electrode; a data line connected to the source electrode; a passivation layer formed on the semiconductor and having a contact hole exposing the drain electrode; and a pixel electrode formed on the passivation layer and connected to the drain electrode through the contact hole.

A manufacturing method of a thin film transistor array panel according to an exemplary embodiment of the present invention includes: forming a gate electrode disposed on an insulation substrate; depositing a gate insulating layer on the gate electrode; forming a semiconductor on the gate insulating layer; and with a single mask, forming an etching stop layer on the semiconductor, an insulating layer on at least a portion of the gate insulating layer, and a source electrode and a drain electrode that each overlap the semiconductor.

The forming of the etching stop layer, the insulating layer, and the source electrode and the drain electrode further includes: depositing an insulating film on the gate insulating layer and the semiconductor; forming a photosensitive film on the insulating film; exposing and developing the photosensitive film to form a photosensitive film pattern; etching the insulating film by using the photosensitive film pattern as the mask to form the etching stop layer and the insulating layer; depositing a metal layer on the photosensitive film pattern and a portion of the gate insulating layer that is not covered by the photosensitive film pattern; and removing the photosensitive film pattern and the metal layer thereon.

The metal layer may include a first portion disposed on the photosensitive film pattern and a second portion on the portion that is not covered by the photosensitive film pattern, and the first portion and the second portion are separated from each other.

The second portion of the metal layer that may not be covered by the photosensitive film pattern includes the source electrode and the drain electrode.

The source electrode and the drain electrode may be disposed on a region of the gate insulating layer that is not covered by the insulating layer.

According to an exemplary embodiment of the present invention, the etching stop layer and the data wire are simultaneously formed through one mask, such the manufacturing cost of the thin film transistor array panel may be reduced, and the manufacturing process may be simplified.

Figure 1:
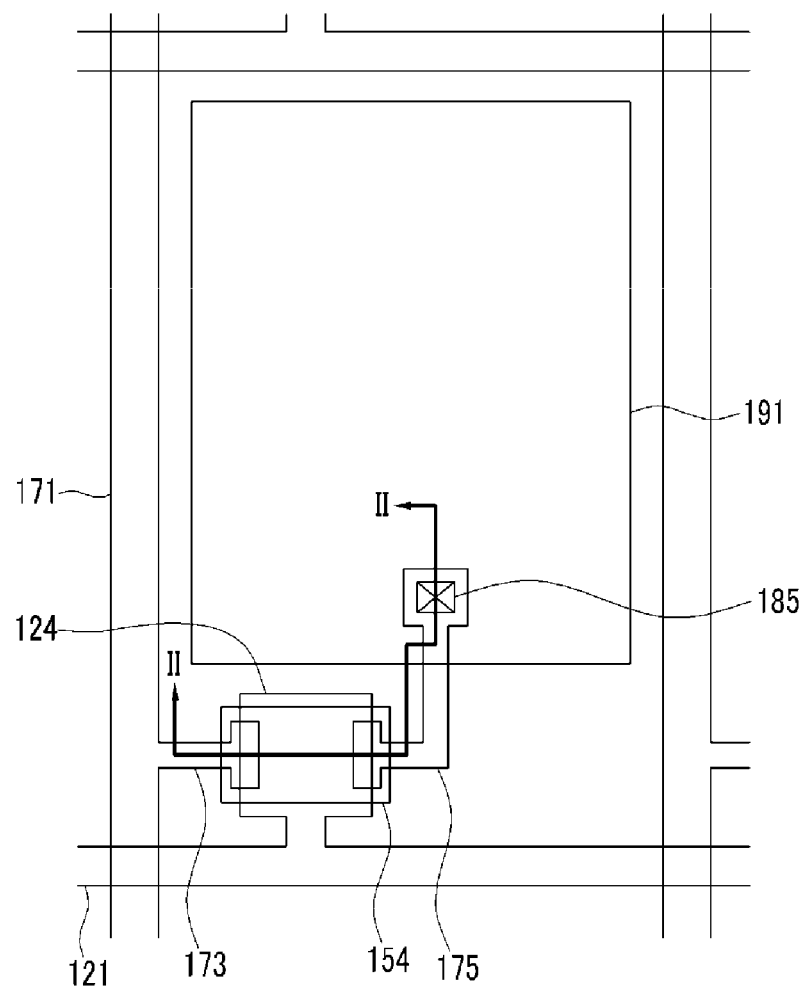
FIG. 1 is a layout view of one pixel of a thin film transistor array panel according to the present invention.

It is understood that the depictions in the figures are diagrammatic and not necessarily to scale.

DETAILED DESCRIPTION OF EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

One embodiment of the invention concerns the formation of an etching stop layer as well as source and drain electrodes, all with a single mask rather than multiple masks. This can be accomplished by forming an insulating material over the semiconductor layer that will be used as the channel region of a TFT. A photosensitive film is formed over the insulating material, and this film and the etching stop layer are etched with a mask to form both an etching stop layer and an insulating layer, where the etching stop layer and insulating layer are disposed on some portions of the gate insulating layer and semiconductor layer, but are not disposed on other portions. That is, the etching stop layer and insulating layer expose portions of the semiconductor layer and gate insulating layer. These exposed portions are in the shape of the source and drain electrodes, so that the source/drain are formed by depositing a conductive layer in the exposed portions. The insulating layer is then lifted off, removing extraneous portions of the conductive layer and leaving the source and drain electrodes, as well as the etching stop and insulating layers. In this manner, only a single mask is required to form multiple different TFT components, resulting in a simpler, cheaper, and less time-consuming fabrication process.

Figure 2:
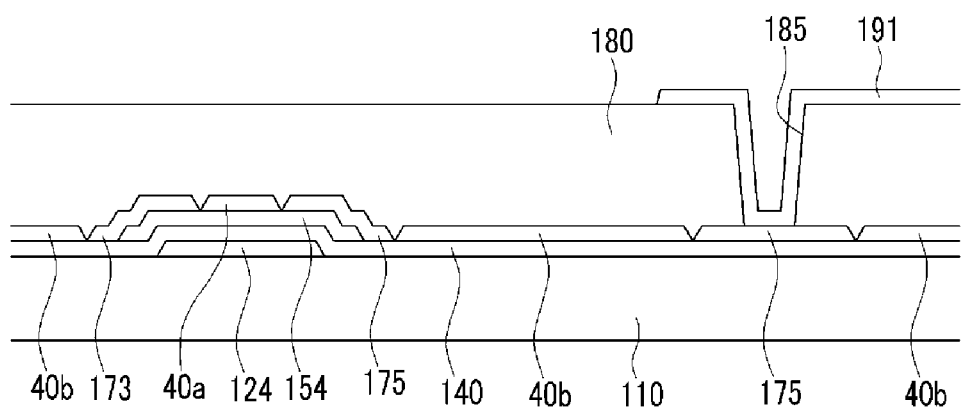
FIG. 2 is a cross-sectional view taken along the line II-II of FIG. 1.

FIG. 1 is a layout view of one pixel of a thin film transistor array panel according to the present invention, and FIG. 2 is a cross-sectional view taken along the line II-II of FIG. 1.

Referring to FIG. 1 and FIG. 2, a plurality of gate lines 121 are formed on an insulation substrate 110 made of transparent glass or plastic.

The gate lines 121 transfer a gate signal, and are extended in a substantially transverse direction. A number of gate electrodes 124 protrude from each gate line 121. The gate line 121 also has an end (not shown) having a wide area for connecting to other layers or an external driving circuit.

A gate insulating layer 140 is formed on the gate line 121. A plurality of semiconductors 154 are then formed on the gate insulating layer 140. The gate insulating layer 140 can be made of any suitable material, such as silicon nitride. Similarly, the semiconductors 154 can be made of any suitable material, such as amorphous silicon or polysilicon.

If the semiconductors 154 are oxide semiconductors, they can be made of materials such as GIZO, ZTO (ZnSnO), or IZO.

An etching stop layer 40a is formed on the semiconductor layer 154. In this embodiment, the etching stop layer 40a is made of silicon nitride and covers the channel of the semiconductor layer 154, thereby preventing the channel of the semiconductor 154 from being damaged by the etchant in subsequent processes. An insulating layer 40b is formed on the gate insulating layer 140, where the insulating layer 40b can be made of the same layer as the etching stop layer 40a. The etching stop layer 40a and the insulating layer 40b are formed of an insulating material such as silicon oxide (SiOx).

A plurality of data lines 171 and a plurality of drain electrodes 175 are formed on the semiconductor 154 that is not covered by the etching stop layer 40a.

The data lines 171 transfer the data signal, and extend in a substantially longitudinal direction, thereby intersecting the gate lines 121. Each data line 171 includes a plurality of source electrodes 173 each extending toward one of the gate electrodes 124, and an end (not shown) having a wide area for connecting to other layers or an external driving circuit.

The drain electrode 175 is separated from the data line 171, and is opposite to the source electrode 173 with respect to the gate electrode 124. The source electrode 173 and the drain electrode 175 directly contact portions of the semiconductor 154 and gate insulating layer 140 that are not covered by either the etching stop layer 40a or the insulating layer 40b.

The data line 171 and the drain electrode 175 are at least partially disposed in areas that are not occupied by either the etching stop layer 40a or the insulating layer 40b. That is, the etching stop layer 40a and the insulating layer 40b largely enclose, or surround, the data line 171 and the drain electrode 175.

One gate electrode 124, one source electrode 173, and one drain electrode 175 form one thin film transistor (TFT) along with the semiconductor 154. The channel of the TFT is formed in the semiconductor 154 between the source electrode 173 and the drain electrode.

A passivation layer 180 is formed on the data line 171, the drain electrode 175, the etching stop layer 40a, and the insulating layer 40b. The passivation layer 180 is made of a suitable material, e.g., an inorganic insulator such as silicon nitride, silicon oxide, an organic insulator, or an insulating material having a low dielectric ratio.

The passivation layer 180 has a plurality of contact holes 185 exposing the drain electrodes 175.

A plurality of pixel electrodes 191 are formed on the passivation layer 180. The pixel electrodes 191 are physically and electrically connected to the drain electrodes 175 through the contact holes 185, and receive the data voltages from the drain electrodes 175. When a pixel electrode 191 has a data voltage applied, and when the common electrode (not shown) of the other panel (not shown) has a common voltage applied to it, the two together generate an electric field in the liquid crystal, aligning the molecules of the liquid crystal and allowing for images to be generated. As the pixel electrodes 191 and the common electrode form a capacitor (hereinafter referred to as "a liquid crystal capacitor"), an applied voltage is sustained even after the thin film transistor is turned off.

The pixel electrode 191 and the storage electrode line (not shown) overlap each other, thereby forming an additional storage capacitor, such that the storage capacitor enhances the voltage sustaining ability of a liquid crystal capacitor.

The pixel electrode 191 may be made of a transparent conductor such as ITO or IZO.

Next, a method of manufacturing the TFT array panel of FIG. 1 and FIG. 2 will be described with reference to FIGS. 3 to 7, as well as FIG. 2.

FIGS. 3 to 7 are cross-sectional views sequentially showing a manufacturing method of a thin film transistor array panel according to an exemplary embodiment of the present invention, and taken along the line II-II of FIG. 1.

Figure 3:
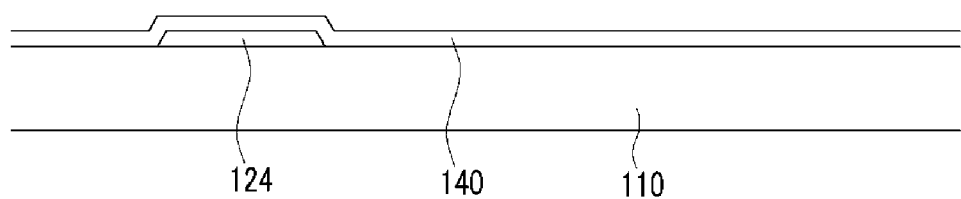
FIGS. 3 to 7 are cross-sectional views sequentially showing a manufacturing method of a thin film transistor array panel according to an exemplary embodiment of the present invention, and taken along the line II-II of FIG. 1.

As shown in FIG. 3, a metal layer is formed on an insulation substrate 110 that is made of transparent glass or plastic. The metal layer is patterned to form a gate line including a gate electrode 124, and a gate insulating layer 140 is deposited on the gate electrode 124.

Figure 4:
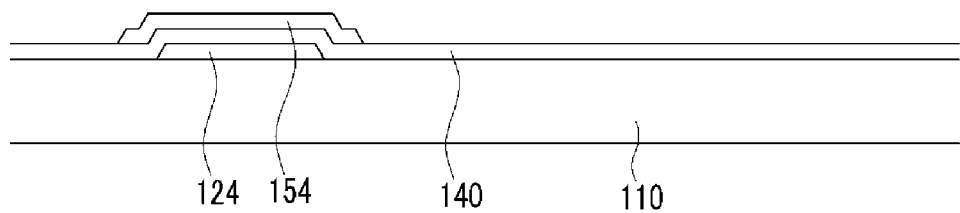

As shown in FIG. 4, a semiconductor 154 that can be an oxide semiconductor is formed on the gate insulating layer 140.

The oxide semiconductor may be formed through vacuum deposition and patterned, or the oxide semiconductor in a solution state may be coated and then patterned after hardening.

Figure 5:
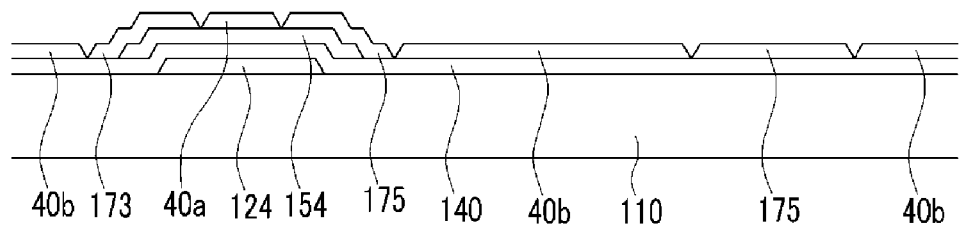

As shown in FIG. 5, an etching stop layer 40a, an insulating layer 40b, and a data line including a source electrode 173 and a drain electrode 175 are formed together on the oxide semiconductor.

Next, a method for forming the etching stop layer 40a, the insulating layer 40b, and the data line including the source electrode 173 and the drain electrode 175 will be described with reference to FIG. 6A to FIG. 6D.

Figure 6A:
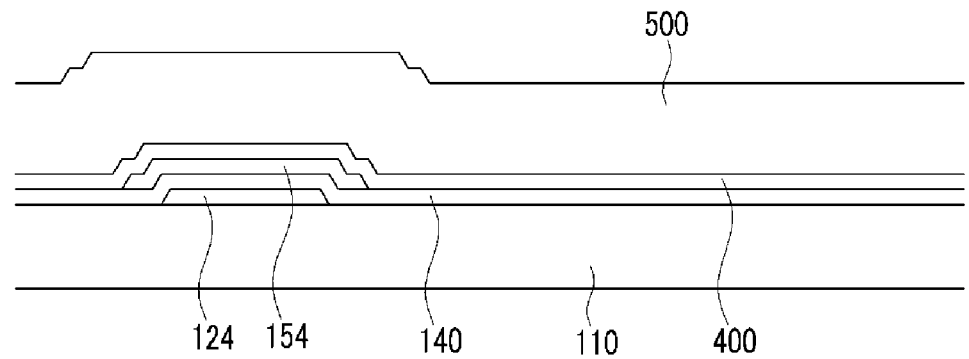

First, referring to FIG. 6A, an insulating layer 400 is deposited on the semiconductor 154 and the gate insulating layer 140, and a photosensitive film 500 is formed on the insulating layer 400.

Figure 6B:
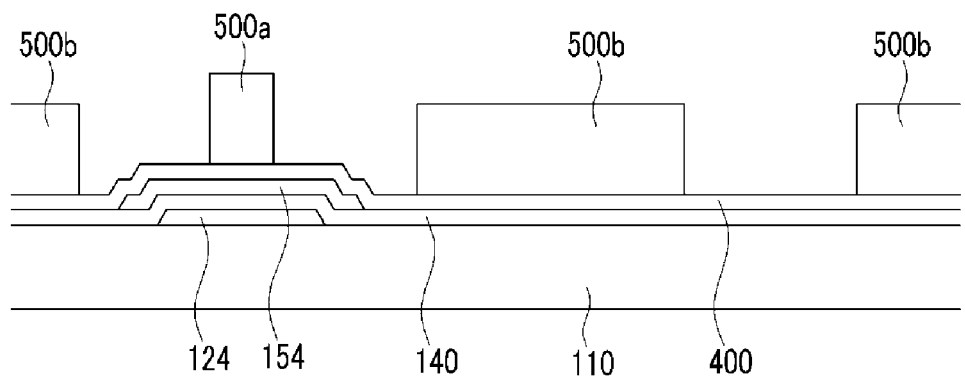

Referring to FIG. 6B, the photosensitive film 500 is exposed and developed by using a mask, so as to form photosensitive film patterns 500a and 500b. The photosensitive film patterns 500a and 500b include a portion 500a disposed at the position where the etching stop layer 40a will be formed, and a portion 500b disposed at the position where the insulating layer 40b will be formed.

Figure 6C:
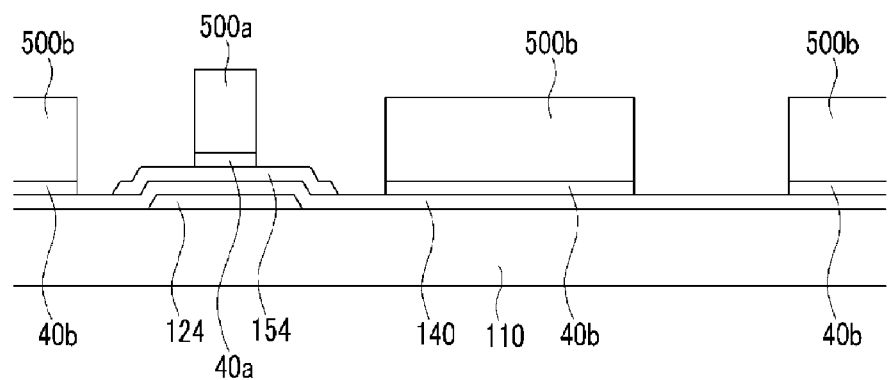

Referring to FIG. 6C, the insulating layer 400 is etched by using the photosensitive film patterns 500a and 500b as a mask, thus forming the etching stop layer 40a and the insulating layer 40b.

Figure 6D:
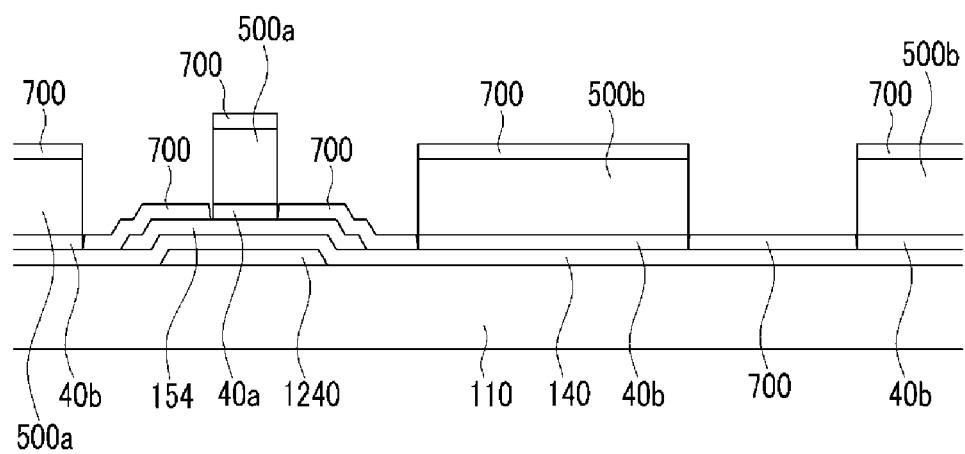

Next, a metal layer 700 is formed on the photosensitive film patterns 500a and 500b and the gate insulating layer 140. The metal layer 700 can be made of the same material as the data line 171 and the drain electrode 175. In areas where the photosensitive film patterns 500a, b are present, the metal layer 700 is deposited upon those patterns 500a, b. However, the metal layer 700 is also deposited in the areas between these patterns 500a, b. In particular, the metal layer 700 is deposited upon portions of the semiconductor 154 and gate insulating layer 140 that lie exposed in various gaps between patterns 500a, b, as shown in FIG. 6D.

Next, the photosensitive film patterns 500a and 500b and their overlying metal layer 700 are removed, such that a data line 171 and a drain electrode 175 disposed in the portion enclosing the etching stop layer 40a and the insulating layer 40b are completed.

As described above, in an exemplary embodiment of the present invention, one mask is used to simultaneously form the etching stop layer 40a as well as the data line 171 and the drain electrode 175. This results in a cheaper and simpler manufacturing process as compared to configurations in which the etching stop layer 40a, the data line 171, and the drain electrode 175 are formed by using different masks.

Figure 7:
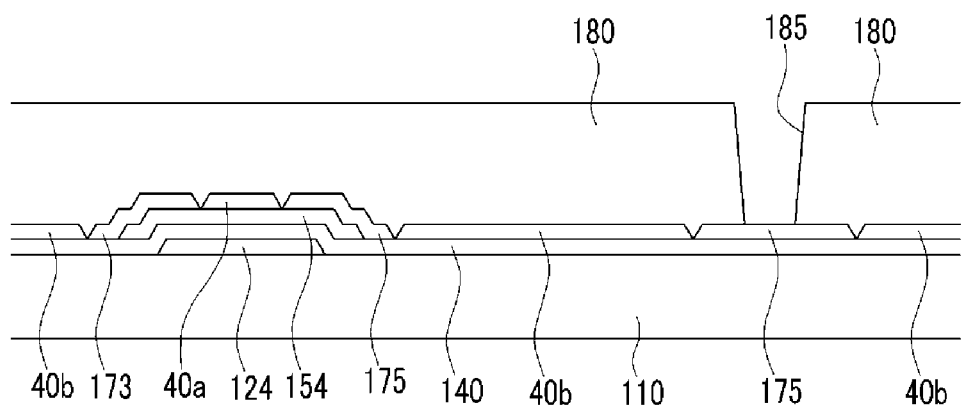

Next, as shown in FIG. 7, a passivation layer 180 is formed on the etching stop layer 40a, the insulating layer 40b, the data line 171, and the drain electrode 175. This passivation layer 180 is patterned to form a contact hole 185 that exposes the drain electrode 175.

Finally, as shown in FIG. 2, a metal layer is deposited and patterned through a process such as photolithography, forming a pixel electrode 191 that is connected to the drain electrode 175 through the contact hole 185.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
a gate electrode disposed on an insulation substrate;
a gate insulating layer disposed on the gate electrode;
a semiconductor disposed on the gate insulating layer;
an etching stop layer disposed on a first portion of the semiconductor;
an insulating layer disposed on a second portion of the gate insulating layer; and
a source electrode and a drain electrode, the source and drain electrodes being disposed overlapping with the semiconductor,
wherein at least one of the source electrode and the drain electrode is disposed on a region comprising a third portion of the semiconductor and a fourth portion of the gate insulating layer, wherein the third portion of the semiconductor and the fourth portion of the gate insulating layer are not covered by either the etching stop layer or the insulating layer.

2. The thin film transistor array panel of claim 1, wherein the etching stop layer and the insulating layer are in the same layer.

3. The thin film transistor array panel of claim 2, wherein the semiconductor is an oxide semiconductor.

4. The thin film transistor array panel of claim 3, wherein the oxide semiconductor includes at least one of GIZO, ZTO (ZnSnO), and IZO.

5. The thin film transistor array panel of claim 3, further comprising:
a gate line connected to the gate electrode;
a data line connected to the source electrode;
a passivation layer formed on the semiconductor and having a contact hole exposing the drain electrode; and
a pixel electrode formed on the passivation layer and connected to the drain electrode through the contact hole.

6. The thin film transistor array panel of claim 1, wherein the semiconductor is an oxide semiconductor.

7. The thin film transistor array panel of claim 6, wherein the oxide semiconductor includes at least one of GIZO, ZTO (ZnSnO), and IZO.

8. The thin film transistor array panel of claim 6, further comprising:
a gate line connected to the gate electrode;
a data line connected to the source electrode;
a passivation layer formed on the semiconductor and having a contact hole exposing the drain electrode; and
a pixel electrode formed on the passivation layer and connected to the drain electrode through the contact hole.

9. The thin film transistor array panel of claim 1, further comprising:
a gate line connected to the gate electrode;
a data line connected to the source electrode;
a passivation layer formed on the semiconductor and having a contact hole exposing the drain electrode; and
a pixel electrode formed on the passivation layer and connected to the drain electrode through the contact hole.

* * * * *